(12) United States Patent
Bartholomeusz et al.

(10) Patent No.: US 8,709,856 B2
(45) Date of Patent: Apr. 29, 2014

(54) ENHANCEMENT OF SEMICONDUCTING PHOTOVOLTAIC ABSORBERS BY THE ADDITION OF ALKALI SALTS THROUGH SOLUTION COATING TECHNIQUES

(75) Inventors: Brian Josef Bartholomeusz, Palo Alto, CA (US); Michael Bartholomeusz, Pheonix, AZ (US)

(73) Assignee: Zetta Research and Development LLC—AQT Series, Wilmington, DE (US)

( * ) Notice: Subject to any disclaimer, the term of this patent is extended or adjusted under 35 U.S.C. 154(b) by 947 days.

(21) Appl. No.: 12/717,767

(22) Filed: Mar. 4, 2010

(65) Prior Publication Data

US 2010/0224247 A1    Sep. 9, 2010

Related U.S. Application Data

(60) Provisional application No. 61/158,657, filed on Mar. 9, 2009.

(51) Int. Cl.
*H01L 21/00* (2006.01)

(52) U.S. Cl.
USPC .......... 438/85; 438/84; 438/95; 438/102; 257/E31.027; 257/E31.008

(58) Field of Classification Search
None
See application file for complete search history.

(56) References Cited

U.S. PATENT DOCUMENTS

| 5,626,688 | A | * | 5/1997 | Probst et al. | 136/265 |
| 5,994,163 | A | * | 11/1999 | Bodeg.ang.rd et al. | 438/84 |
| 7,018,858 | B2 | * | 3/2006 | Aoki et al. | 438/22 |
| 2008/0169025 | A1 | * | 7/2008 | Basol et al. | 136/262 |

* cited by examiner

*Primary Examiner* — Zandra Smith
*Assistant Examiner* — Khanh Duong
(74) *Attorney, Agent, or Firm* — Mattingly & Malur, PC

(57) ABSTRACT

In particular embodiments, a method is described for forming photovoltaic devices that includes providing a substrate suitable for use in a photovoltaic device, depositing a conductive contact layer over the substrate, depositing a salt solution over the surface of the conductive contact layer, the solution comprising a volatile solvent and an alkali metal salt solute, and depositing a semiconducting absorber layer over the solute residue left by the evaporated solvent.

14 Claims, 5 Drawing Sheets

ENHANCEMENT OF SEMICONDUCTING PHOTOVOLTAIC ABSORBERS BY THE ADDITION OF ALKALI SALTS THROUGH SOLUTION COATING TECHNIQUES

RELATED APPLICATIONS

This application claims the benefit, under 35 U.S.C. §119 (e), of U.S. Provisional Patent Application No. 61/158,657, entitled Enhancement of Semiconducting Photovoltaic Absorbers by the Addition of Alkali Salts Through Solution and Spray Coating Techniques, filed 9 Mar. 2009, and hereby incorporated by reference herein.

TECHNICAL FIELD

The present disclosure generally relates to photovoltaic devices, and more particularly to thin film semiconducting photovoltaic absorbers.

BACKGROUND

P-n junction based photovoltaic cells are commonly used as solar cells. Generally, p-n junction based photovoltaic cells include a layer of an n-type semiconductor in direct contact with a layer of a p-type semiconductor. By way of background, when a p-type semiconductor is positioned in intimate contact with an n-type semiconductor a diffusion of electrons occurs from the region of high electron concentration (the n-type side of the junction) into the region of low electron concentration (the p-type side of the junction). However, the diffusion of charge carriers (electrons) does not happen indefinitely, as an opposing electric field is created by this charge imbalance. The electric field established across the p-n junction induces a separation of charge carriers that are created as result of photon absorption.

Chalcogenide (both single and mixed) semiconductors have optical band gaps well within the terrestrial solar spectrum, and hence, can be used as photon absorbers in thin film based photovoltaic cells, such as solar cells, to generate electron-hole pairs and convert light energy to usable electrical energy. More specifically, semiconducting chalcogenide films are typically used as the absorber layers in such devices. A chalcogenide is a chemical compound consisting of at least one chalcogen ion (group 16 (VIA) elements in the periodic table, e.g., sulfur (S), selenium (Se), and tellurium (Te)) and at least one more electropositive element. As those of skill in the art will appreciate, references to chalcogenides are generally made in reference to sulfides, selenides, and tellurides. Thin film based solar cell devices may utilize these chalcogenide semiconductor materials as the absorber layer(s) as is or, alternately, in the form of an alloy with other elements or even compounds such as oxides, nitrides and carbides, among others.

A number of electronic and structural effects have been attributed to the presence of sodium (Na) in the fabrication of Copper-Indium-disulfide ("CIS2"), Copper-Indium-diselenide ("CIS"), Copper-Indium-Gallium-diselenide ($CuIn_xGa_{(1-x)}Se_2$, "CIGS"), and various chalcopyrite-based thin film photovoltaic devices. These results have been generated over the past two decades and a variety of hypotheses have been proposed for the action of the Na. However, due to subtle variations and contradictions in experimental observations, none of these models has become universally accepted to date.

BRIEF DESCRIPTION OF THE DRAWINGS

The present disclosure is illustrated by way of example, and not by way of limitation, in the figures of the accompanying drawings and in which like reference numerals refer to similar elements and in which.

DESCRIPTION OF EXAMPLE EMBODIMENTS

Figure 1A:
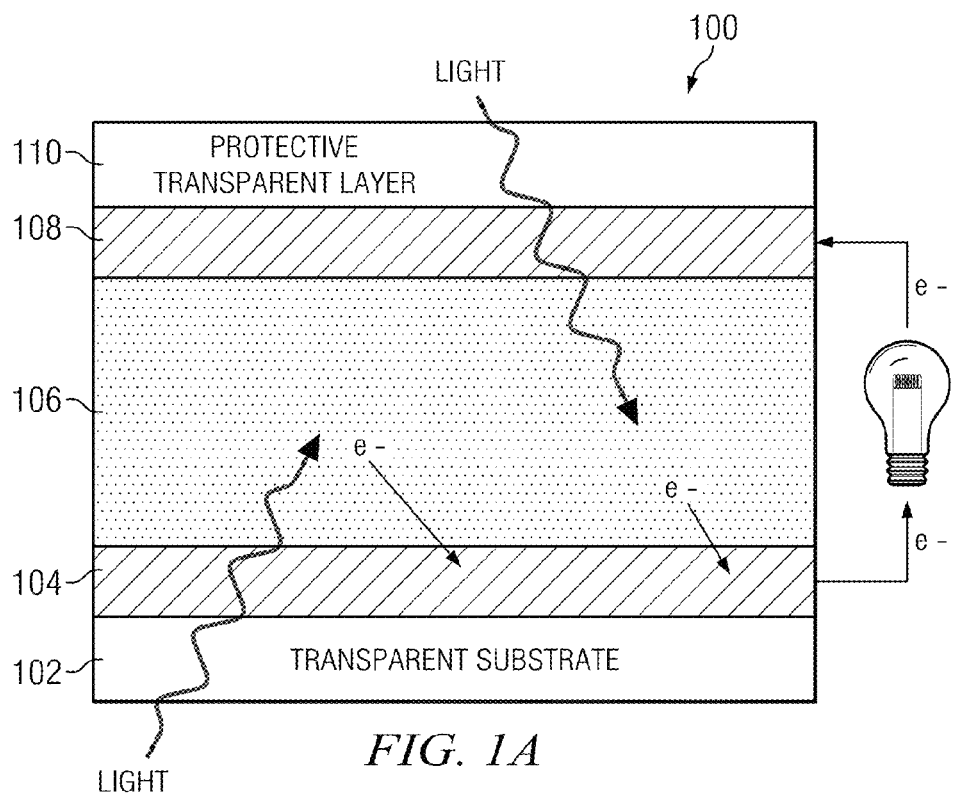
FIGS. 1A-1D each illustrates a diagrammatic cross-sectional side view of an example solar cell configuration.

The present disclosure is now described in detail with reference to a few particular embodiments thereof as illustrated in the accompanying drawings. In the following description, numerous specific details are set forth in order to provide a thorough understanding of the present disclosure. It is apparent, however, to one skilled in the art, that particular embodiments of the present disclosure may be practiced without some or all of these specific details. In other instances, well known process steps and/or structures have not been described in detail in order to not unnecessarily obscure the present disclosure. In addition, while the disclosure is described in conjunction with the particular embodiments, it should be understood that this description is not intended to limit the disclosure to the described embodiments. To the contrary, the description is intended to cover alternatives, modifications, and equivalents as may be included within the spirit and scope of the disclosure as defined by the appended claims.

Particular embodiments relate to absorber structures for use in photovoltaic devices (hereinafter also referred to as "photovoltaic cells," "solar cells," or "solar devices"). Particular embodiments more specifically relate to the use of alkali metal salts dissolved in volatile solvents in concentrations less than or equal to approximately 1 atomic % to enhance structural and electronic properties of semiconducting absorber layers for use in photovoltaic devices. In particular embodiments, the disclosed techniques may result in chalcogenide absorber layer structures in which a majority of the materials forming the respective structures have chalcopyrite phase. In even more particular embodiments, greater than 90 percent of the resultant chalcogenide absorber layer structures are in the chalcopyrite phase.

Copper indium gallium diselenide (e.g., $Cu(In_{1-x}Ga_x)Se_2$), copper indium gallium selenide sulfide (e.g., $Cu(In_{1-x}Ga_x)(Se_{1-y}S_y)_2$), and copper indium gallium disulfide (e.g., $Cu(In_{1-x}Ga_x)S_2$), each of which is commonly referred to as a "CIGS" material or structure, Copper-Indium-disulfide, commonly referred to as a "CIS2" material or structure, Copper-Indium-diselenide, commonly referred to as a "CIS" material or structure, have been successfully used in the fabrication of thin film absorbers in photovoltaic cells largely due to their relatively large absorption coefficients. In fact, photovoltaic cells having photovoltaic efficiencies greater or equal than approximately 20% have been manufactured using copper indium gallium diselenide absorber layers.

Hereinafter, reference to a layer may encompass a film, and vice versa, where appropriate. Additionally, reference to a layer may encompass a multilayer structure including one or more layers, where appropriate. As such, reference to an absorber may be made with reference to one or more absorber layers that collectively are referred to hereinafter as absorber, absorber layer, absorber structure, or absorber layer structure.

Additionally, as used herein, "or" may imply "and" as well as "or;" that is, "or" does not necessarily preclude "and," unless explicitly stated or implicitly implied.

Figure 1B:
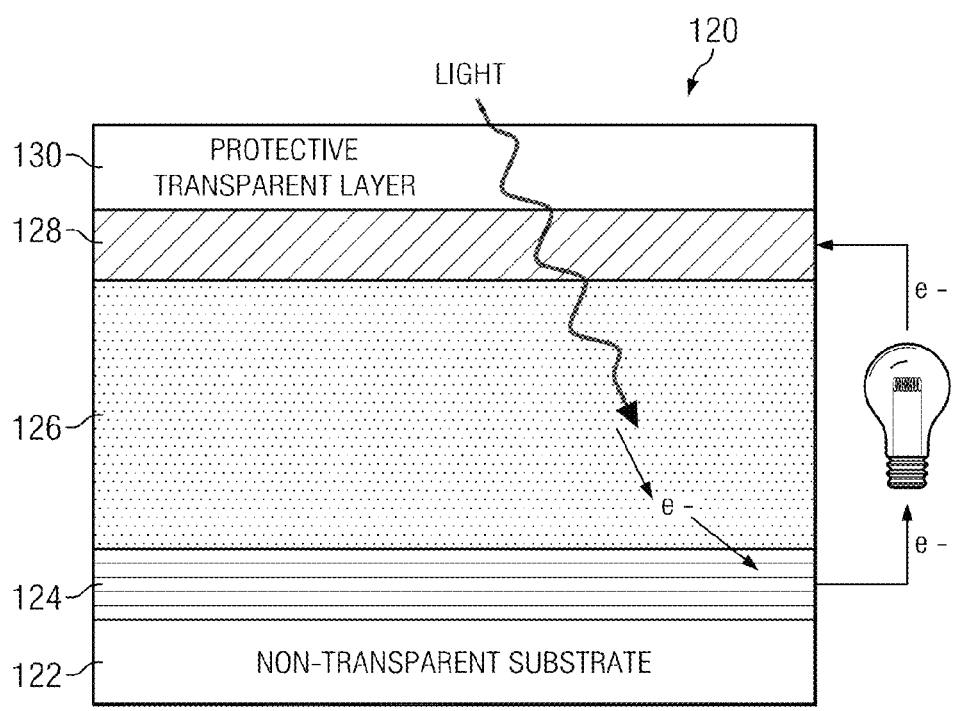
Figure 1C:
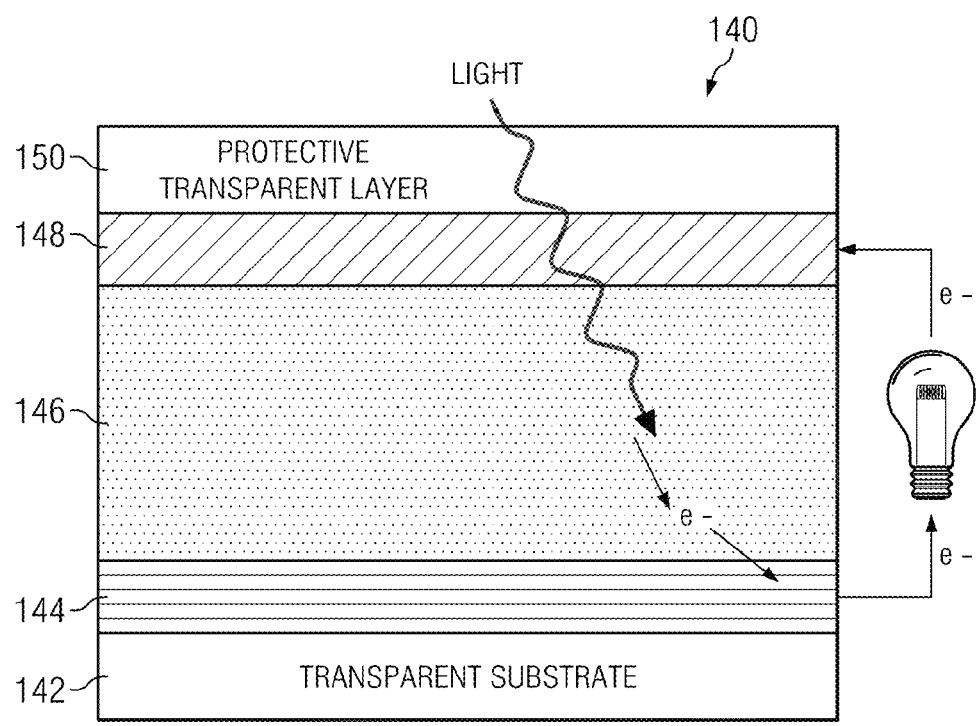
Figure 1D:
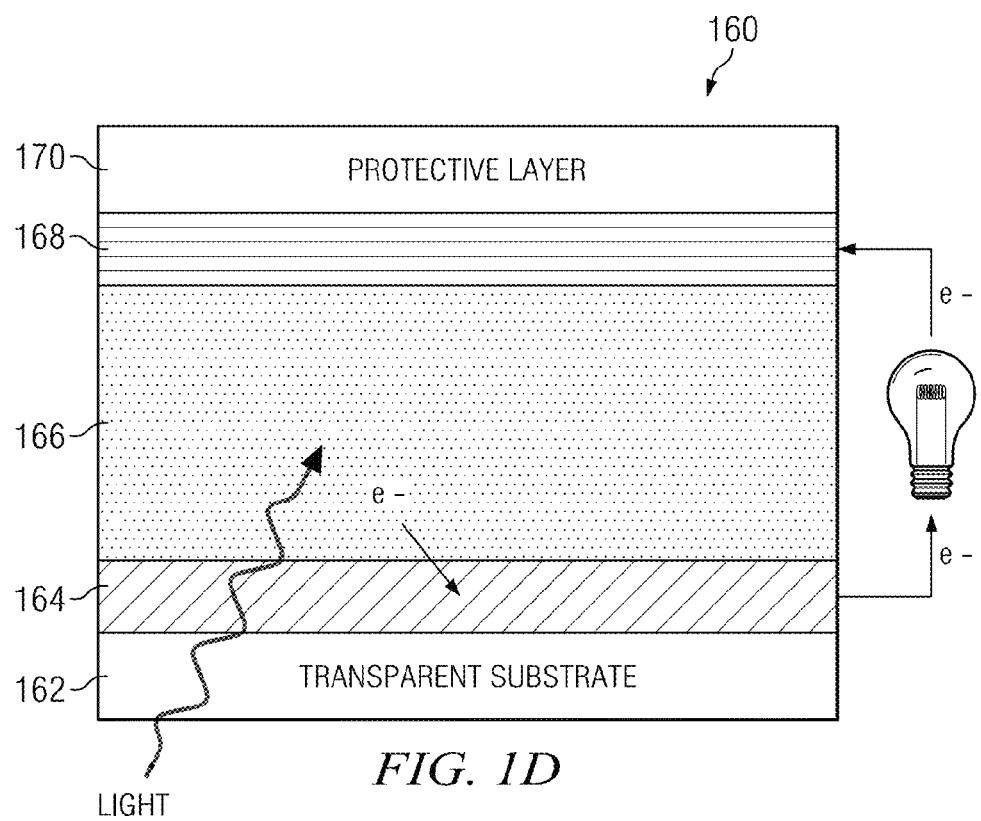

FIGS. 1A-1D illustrate various general example solar cell designs. FIG. 1A illustrates an example solar cell 100 that includes, in overlying sequence, a transparent glass substrate 102, a transparent conductive (contact) layer 104, a conversion layer 106, a transparent conductive (contact) layer 108, and a protective transparent layer 110. In this example solar cell design, light can enter the solar cell 100 from the top (through the protective transparent layer 110) or from the bottom (through the transparent substrate 102). FIG. 1B illustrates another example solar cell 120 that includes, in overlying sequence, a non-transparent substrate (e.g., a metal, plastic, ceramic, or other suitable non-transparent substrate) 122, a conductive layer 124, a conversion layer 126, a transparent conductive layer 128, and a protective transparent layer 130. In this example solar cell design, light can enter the solar cell 120 from the top (through the protective transparent layer 130). FIG. 1C illustrates another example solar cell 140 that includes, in overlying sequence, a transparent substrate (e.g., a glass, plastic, or other suitable transparent substrate) 142, a conductive layer 144, a conversion layer 146, a transparent conductive layer 148, and a protective transparent layer 150. In this example solar cell design, light can enter the solar cell 140 from the top (through protective transparent layer 150). FIG. 1D illustrates yet another example solar cell 160 that includes, in overlying sequence, a transparent substrate (e.g., a glass, plastic, or other suitable transparent substrate) 162, a transparent conductive layer 164, a conversion layer 166, a conductive layer 168, and a protective layer 170. In this example solar cell design, light can enter the solar cell 160 from the bottom (through the transparent substrate 162).

In order to achieve charge separation (the separation of electron-hole pairs) during operation of the resultant photovoltaic devices, each of the conversion layers 106, 126, 146, and 166 are comprised of at least one n-type semiconductor material and at least one p-type semiconductor material. In particular embodiments, each of the conversion layers 106, 126, 146, and 166 are comprised of at least one or more absorber layers and one or more buffer layers having opposite doping as the absorber layers. By way of example, if the absorber layer is formed from a p-type semiconductor, the buffer layer is formed from an n-type semiconductor. On the other hand, if the absorber layer is formed from an n-type semiconductor, the buffer layer is formed from a p-type semiconductor. More particular embodiments of example conversion layers suitable for use as one or more of conversion layers 106, 126, 146, or 166 will be described later in the present disclosure.

In particular embodiments, each of the transparent conductive (contact) layers 104, 108, 128, 148, or 164 is comprised of at least one oxide layer. By way of example and not by way of limitation, the oxide layer forming the transparent conductive layer may include one or more layers each formed of one or more of: titanium oxide (e.g., one or more of $TiO$, $TiO_2$, $Ti_2O_3$, or $Ti_3O_5$), aluminum oxide (e.g., $Al_2O_3$), cobalt oxide (e.g., one or more of $CoO$, $Co_2O_3$, or $Co_3O_4$), silicon oxide (e.g., $SiO_2$), tin oxide (e.g., one or more of $SnO$ or $SnO_2$), zinc oxide (e.g., $ZnO$), molybdenum oxide (e.g., one or more of $Mo$, $MoO_2$, or $MoO_3$), tantalum oxide (e.g., one or more of $TaO$, $TaO_2$, or $Ta_2O_5$), tungsten oxide (e.g., one or more of $WO_2$ or $WO_3$), indium oxide (e.g., one or more of $InO$ or $In_2O_3$), magnesium oxide (e.g., $MgO$), bismuth oxide (e.g., $Bi_2O_3$), copper oxide (e.g., $CuO$), vanadium oxide (e.g., one or more of $VO$, $VO_2$, $V_2O_3$, $V_2O_5$, or $V_3O_5$), chromium oxide (e.g., one or more of $CrO_2$, $CrO_3$, $Cr_2O_3$, or $Cr_3O_4$), zirconium oxide (e.g., $ZrO_2$), or yttrium oxide (e.g., $Y_2O_3$). Additionally, in various embodiments, the oxide layer may be doped with one or more of a variety of suitable elements or compounds. In one particular embodiment, each of the transparent conductive layers 104, 108, 128, 148, or 164 may be comprised of ZnO doped with at least one of: aluminum oxide, titanium oxide, zirconium oxide, vanadium oxide, or tin oxide. In another particular embodiment, each of the transparent conductive layers 104, 108, 128, 148, or 164 may be comprised of indium oxide doped with at least one of: aluminum oxide, titanium oxide, zirconium oxide, vanadium oxide, or tin oxide. In another particular embodiment, each of the transparent conductive layers 104, 108, 128, 148, or 164 may be a multi-layer structure comprised of at least a first layer formed from at least one of: zinc oxide, aluminum oxide, titanium oxide, zirconium oxide, vanadium oxide, or tin oxide; and a second layer comprised of zinc oxide doped with at least one of: aluminum oxide, titanium oxide, zirconium oxide, vanadium oxide, or tin oxide. In another particular embodiment, each of the transparent conductive layers 104, 108, 128, 148, or 164 may be a multi-layer structure comprised of at least a first layer formed from at least one of: zinc oxide, aluminum oxide, titanium oxide, zirconium oxide, vanadium oxide, or tin oxide; and a second layer comprised of indium oxide doped with at least one of: aluminum oxide, titanium oxide, zirconium oxide, vanadium oxide, or tin oxide.

In particular embodiments, each of the conductive (contact) layers 124, 144, or 168 is comprised of at least one metal or metallic layer. By way of example and not by way of limitation, each of conductive layers 124, 144, or 168 may be formed of one or more layers each individually or collectively containing at least one of: aluminum (Al), titanium (Ti), vanadium (V), chromium (Cr), manganese (Mn), iron (Fe), cobalt (Co), nickel (Ni), copper (Cu), zirconium (Zr), niobium (Nb), molybdenum (Mo), ruthenium (Ru), rhodium (Rh), palladium (Pd), platinum (Pt), silver (Ag), hafnium (Hf), tantalum (Ta), tungsten (W), rhenium (Re), iridium (Ir), or gold (Au). In one particular embodiment, each of conductive layers 124, 144, or 168 may be formed of one or more layers each individually or collectively containing at least one of: Al, Ti, V, Cr, Mn, Fe, Co, Ni, Cu, Zr, Nb, Mo, Ru, Rh, Pd, Pt, Ag, Hf, Ta, W, Re, Ir, or Au; and at least one of: boron (B), carbon (C), nitrogen (N), lithium (Li), sodium (Na), silicon (Si), phosphorus (P), potassium (K), cesium (Cs), rubidium (Rb), sulfur (S), selenium (Se), tellurium (Te), mercury (Hg), lead (Pb), bismuth (Bi), tin (Sn), antimony (Sb), or germanium (Ge). In another particular embodiment, each of conductive layers 124, 144, or 168 may be formed of a Mo-based layer that contains Mo and at least one of: B, C, N, Na, Al, Si, P, S, K, Ti, V, Cr, Mn, Fe, Co, Ni, Cu, Zn, Ga, Ge, Se, Rb, Zr, Nb, Mo, Ru, Rh, Pd, Ag, Cs, Hf, Ta, W, Re, Ir, Pt, Au, Hg, Pb, or Bi. In another particular embodiment, each of conductive layers 124, 144, or 168 may be formed of a multi-layer structure comprised of an amorphous layer, a face-centered cubic (fcc) or hexagonal close-packed (hcp) interlayer, and a Mo-based layer. In such an embodiment, the amorphous layer may be comprised of at least one of: CrTi, CoTa, CrTa, CoW, or glass; the fcc or hcp interlayer may be comprised of at least one of: Al, Ni, Cu, Ru, Rh, Pd, Ag, Ir, Pt, Au, or Pb; and the Mo-based layer may be comprised of at least one of Mo and at least one of: B, C, N, Na, Al, Si, P, S, K, Ti, V, Cr, Mn, Fe, Co, Ni, Cu, Zn, Ga, Ge, Se, Rb, Zr, Nb, Mo, Ru, Rh, Pd, Ag, Cs, Hf, Ta, W, Re, Ir, Pt, Au, Hg, Pb, or Bi.

Primary enhancements in the fabrication of CIS2, CIS, CIGS, and various chalcopyrite-based thin film photovoltaic (PV) devices attributed to sodium (Na) may be both electronic and structural. By way of example, electronic enhancements may include an increase of net carrier concentration and film transverse (in-plane) conductivity, as well as improved conversion efficiencies of the resultant photovoltaic devices. Structural enhancements (that may or may not contribute to all the observed electronic improvements) may include increased grain size and improved film texture. However, results from various research groups suggest that these structural effects are not simply influenced by the presence of Na, but also by the specific processing conditions, so that the effects of Na can be complicated and obscured by a multitude of factors. There are some who postulate that the presence of Na in turn attracts oxygen (O) and this results in performance improvements through defect healing and vacancy passivation.

A variety of methods have been adopted to facilitate Na incorporation into photovoltaic devices, and particularly, into the absorber layers of these devices. In one simple conventional method, a somewhat uncontrolled source of the Na is within the soda lime glass substrate that is used during the fabrication of the device. It is thought by many that under high temperature processing conditions, Na from the substrate diffuses through a Molybdenum bottom contact into the absorber layer and influences the characteristics of the absorber layer.

Another conventional method is to deposit a thin layer of (typically) sodium-flouride (NaF) onto the surface of the Molybdenum bottom contact by resistive heating or evaporation. This method of Na incorporation is commonly used in scenarios where non-Na containing substrates are used (for example, Stainless Steel or Kapton).

Finally, some researchers have introduced Na after the absorber layer film growth process by evaporating NaF onto the surface of the absorber layer and then subjecting it to various annealing treatments to facilitate Na diffusion. It has been found that this post-processing with Na is less effective than when Na is present during the actual absorber layer film growth process since it does not impact the final film morphology and any enhancements are purely electronic ones. However, there have been improvements in device performance due to this Na incorporation, particularly for films grown at lower temperatures.

In general, for CIS2 films, it is thought by many that the presence of Na is of little or no significance in copper (Cu) rich absorber layer compositions whereas it is of critical importance for Indium (In) rich absorber layer films. For CIGS films, on the other hand, the presence of Na is generally viewed as vital for high performance across a broad compositional and processing spectrum.

It has been postulated that due to its low solubility in the bulk phases, Na resides at grain boundaries in the deposited absorber layer films, and as such, passivates them as well as surfaces. It has also been suggested that the presence of Na induces the diffusion of Oxygen (O) into the film resulting in the subsequent passivation of sulfur (S) vacancies. Other researchers have suggested that the Na forms fluxes (molten salts) that reside on the outside of growing grains and assist in large grain growth.

To date, the most common alkali metal salts that have been proposed for enhancing CIS/CIGS type absorbers are NaF, $Na_2O_2$ and $Na_2O$. A conventional method of introducing these alkali salts during the absorber layer growth process is to deposit between 0 and 15 nanometers (nm) of these alkali metal salts by vacuum evaporation onto the surface of the bottom (e.g., molybdenum) conductive layer.

Particular embodiments of the present disclosure relate to the use of alkali metal salts dissolved in volatile solvents in concentrations less than or equal to approximately 1 atomic percent (at %) to enhance structural and electronic properties of semiconducting absorber layers for use in photovoltaic devices. The present inventors have determined that relatively dilute solutions may generally result in more uniform, continuous coatings.

Figure 2:
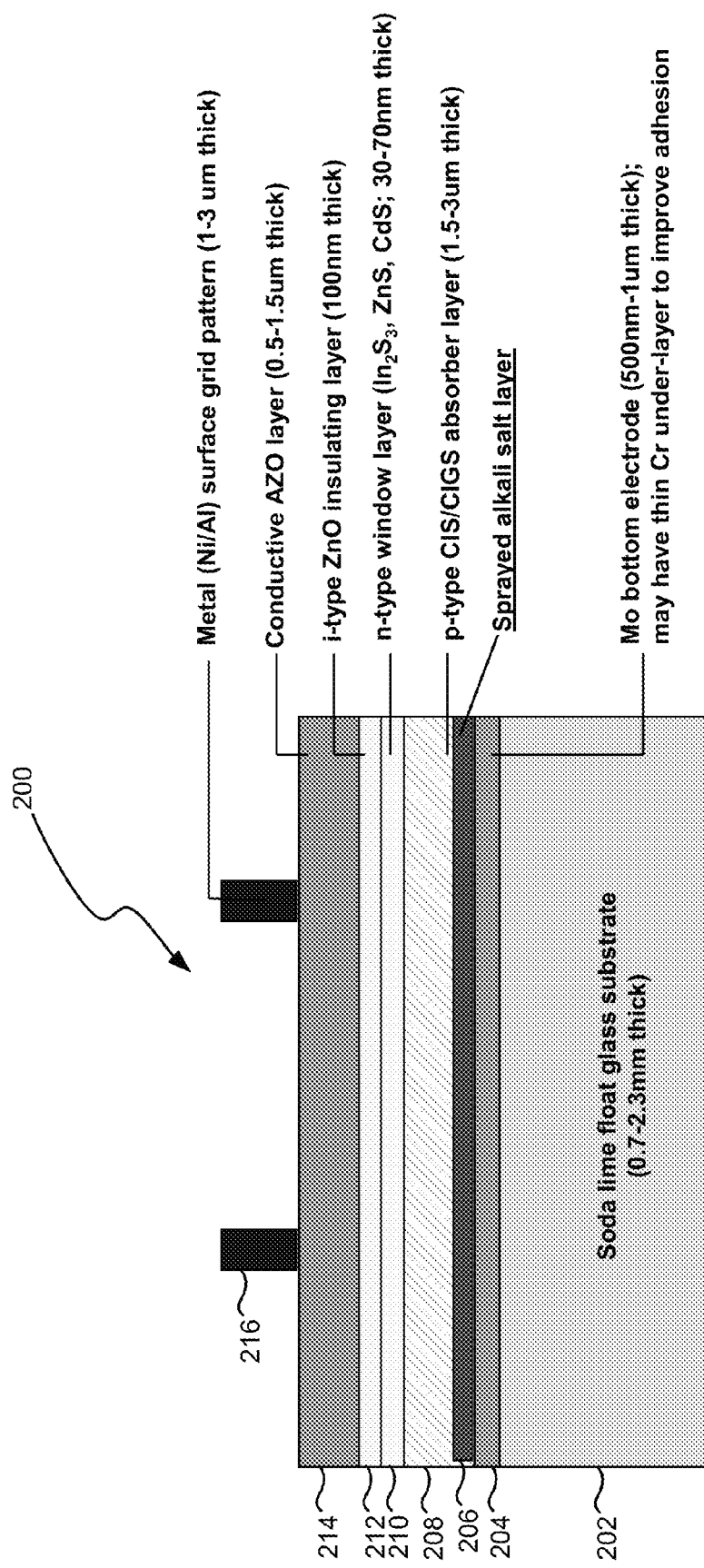
FIG. 2 illustrates a diagrammatic cross-sectional side view of a particular example photovoltaic cell in accordance with an embodiment of the present disclosure.
Figure 3:
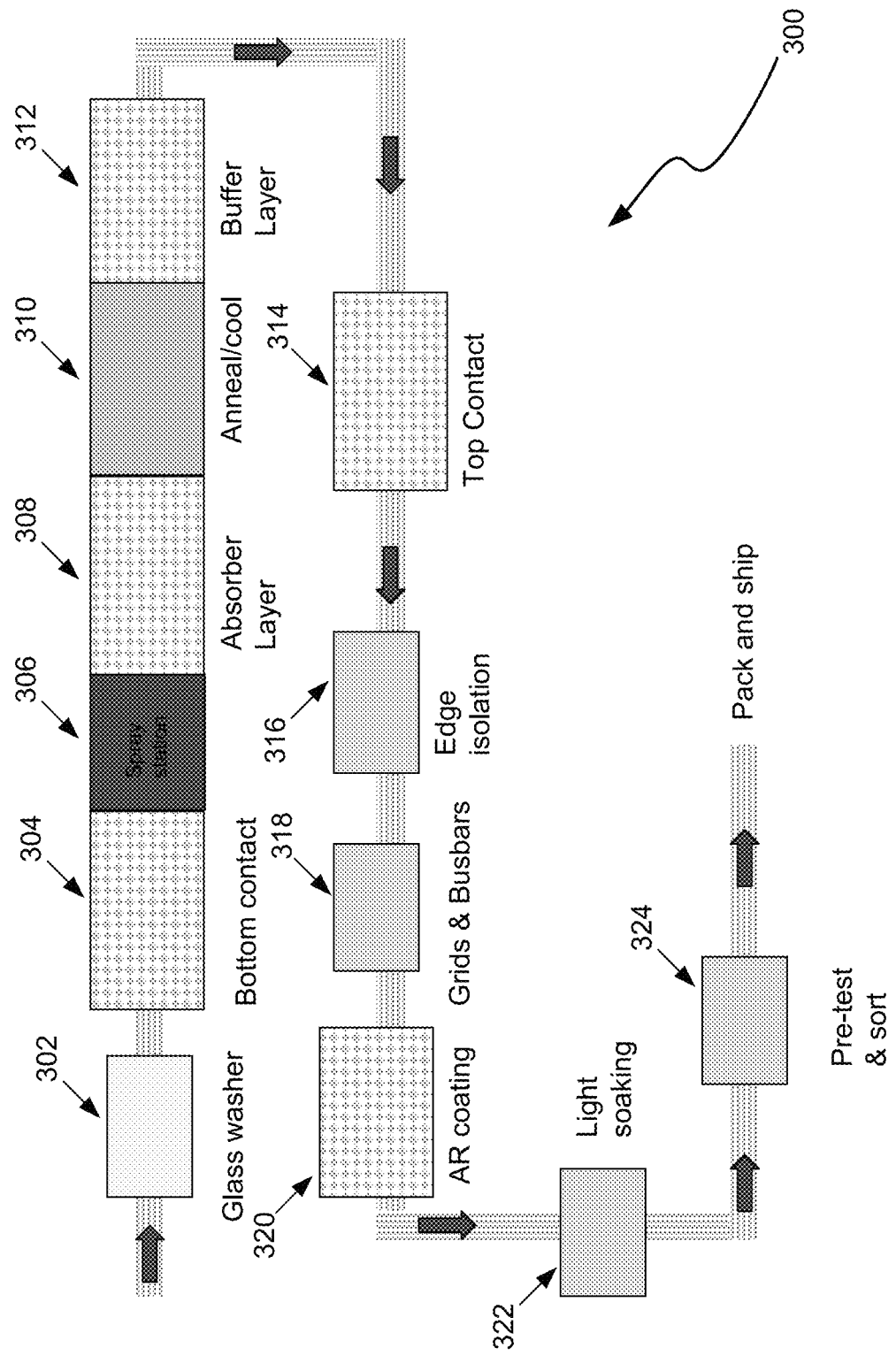
FIG. 3 shows a process flow diagram illustrating an example process for fabricating photovoltaic cells having thin film absorber layers.

FIG. 2 illustrates a diagrammatic cross-sectional side view of a more particular example photovoltaic cell 200 in accordance with a particular embodiment of the present disclosure. The fabrication of photovoltaic cell 200 will be described with reference to FIG. 3, which shows a process flow diagram illustrating an example process 300 for fabricating photovoltaic cells having thin film absorber layers. In particular embodiments, the process begins at 302 with the washing of the substrate 202. By way of example, as described above, the substrate 202 may be a glass substrate, and in particular embodiments, a soda lime float glass substrate, and may be washed with deionized water. Although suitable thicknesses may vary, in some embodiments the thickness of the substrate 202 is in the range of approximately 0.7-2.3 millimeters (mm). At 304, the bottom contact layer 204 is deposited. In a particular embodiment, the bottom contact 204 is formed from Molybdenum (Mo) and may be deposited by any suitable means such as, by way of example, sputtering or evaporation, among other suitable techniques.

At 306, an alkali metal salt layer 206 is deposited in the form of a liquid solution on the surface of the bottom contact 204. By way of example, the alkali metal salt layer may comprise one or more alkali metals such as, by way of example and not necessarily by way of limitation, lithium (Li), sodium (Na), potassium (K), rubidium (Rb), or caesium (Cs). The cation(s) for the salt layer 206 is chosen such that it provides a complementary enhancement to the absorber layer 208. By way of example, suitable cations include, by way of example and not necessarily by way of limitation, fluorine (F), chlorine (Cl), bromine (Br), iodine (I), sulfur (S), selenium (Se), tellurium (Te), and oxygen (O). In particular embodiments, one or more of the alkali metal salt compound solutions are deposited individually or in combination on the surface of the bottom contact 104 prior to the deposition of the absorber layer 208.

Figure 4:
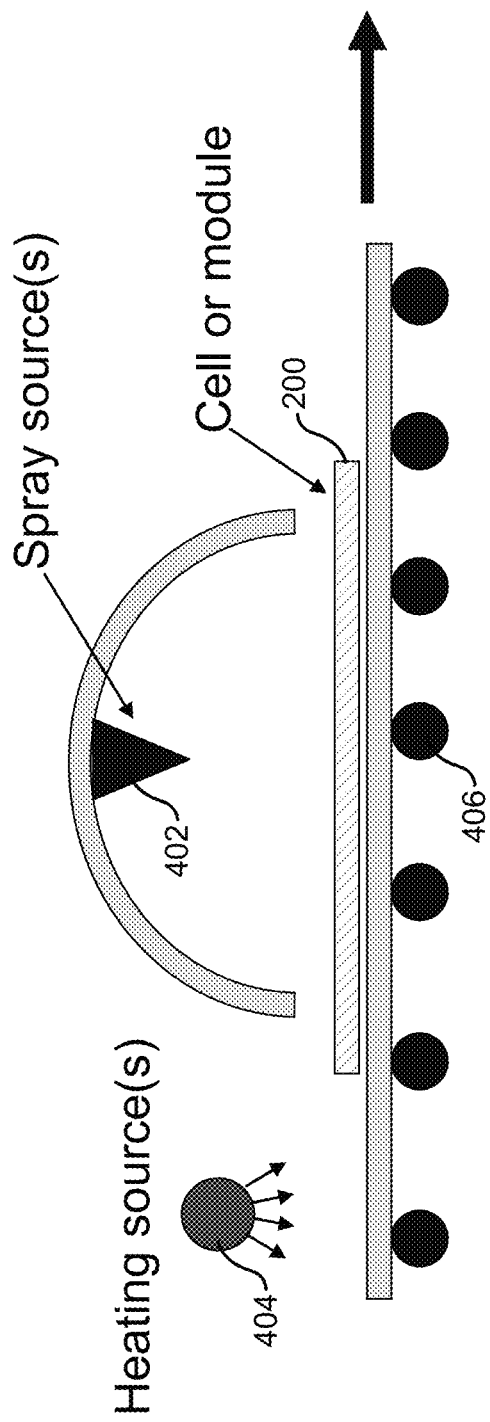
FIG. 4 illustrates a diagrammatic side view of an example spraying system.

In particular embodiments, prior to deposition over the bottom contact layer 204, the alkali metal salt(s) used to form the salt layer 306 are first dissolved in a suitable volatile solvent such as, by way of example, acetone, ethanol, methanol, or other alcohols or suitable volatile solvents (even water), and subsequently applied onto the surface of the contact layer 204 by spraying, dipping, spin coating and/or other suitable solution coating techniques. By way of example, in one embodiment, an NaI salt is used to form the salt layer 206. NaI is moderately soluble in Acetone and can be readily deposited uniformly using a spray nozzle. In a preferred embodiment the alkali metal salt solution is sprayed onto the surface of the contact layer 204 using a spray nozzle such that the solution is applied to the surface of the contact layer in the form of a fine mist (i.e., the solution droplets are very small). FIG. 4 illustrates a diagrammatic side view of a spraying system 400 including a nozzle 402, heat source 404, and roller platform 406 (to transfer cell 200 during the process). The distance between the nozzle 402 and surface of the cell 200 may be optimized based on the size (e.g., length and width) of the cell.

In particular embodiments, the alkali salt solution concentration and dosage is chosen so as to provide a deposited salt layer 208 with a thickness greater than 0 nanometers (nm) but less than approximately 25 nm. By way of reference, 12 nm is a typical thickness for NaI. In particular embodiments, it is advantageous to use a dilute solution (e.g., less than or equal to approximately 1 atomic % in some particular embodiments) deposited in a sufficient quantity (to cover the entire surface of the bottom contact layer 204 uniformly) and in a fine mist (e.g., using a fine nozzle) to facilitate uniform coverage across the surface of the bottom contact layer 204. In this manner, a uniform salt layer 206 may be deposited onto the surface of the bottom contact layer 204. More particularly, since a volatile solvent is preferably used, upon contact with the surface of the bottom contact layer 204, the solvent preferably evaporates very rapidly thereby depositing the salt within the solution droplets onto the surface approximately where the solution droplets contact the surface of the contact layer. By way of example, in particular embodiments, it may be desirable for the solvent to evaporate in less than 10 seconds or even less than 1 second, and, in some embodiments, almost instantaneously thereby leaving little or no time for surface tension to induce droplet aggregation, which may prevent uniform coverage. Furthermore, in a particular embodiment, the substrate 202 may be heated during the salt layer deposition process to speed up drying, prevent surface tension induced droplet aggregation, and thereby improve uniformity of the resultant salt layer 206. In fact, heating the substrate 202 may facilitate the use of water as a solvent candidate.

It should also be noted that relatively larger (in terms of surface area, and even much larger, photovoltaic cells and complete modules may be formed with embodiments of the present disclosure. More particularly, by spraying a dilute alkali salt solution over the bottom contact layer, a much larger (in terms of surface area) cell (or panel) may be formed while maintaining uniform coverage, as compared to conventional methods.

At 308, the absorber layer 208 is deposited. By way of example, in a particular embodiment the absorber layer 208 may be formed from a p-type CIS, CIS2, or CIGS semiconducting material. The absorber layer 208 may be deposited using any suitable means (e.g., sputtering). Although suitable thicknesses may vary, in some particular embodiments, the thickness of the absorber layer 208 is in the range of 1.5-3 microns (μm).

In some particular embodiments, following deposition of the absorber layer 208, the substrate 202, bottom contact layer 204, and absorber layer 208 may be annealed at 310 and subsequently cooled. Annealing may facilitate further migration of the alkali metal(s) from the salt layer 206 into the absorber layer 208. At 312 a buffer (or window) layer 210 may be deposited over the absorber layer 208. By way of example, the buffer layer 210 may be formed of an n-type semiconducting material (or generally a semiconducting material of opposite doping as the absorber layer 206) such as, by way of example, $In_2S_3$, ZnS, CdS, among others and deposited with a thickness in the range of approximately, by way of example, 30-70 nm using any suitable deposition means. At 314, the top contact layer 214 is then deposited over the buffer layer 210. By way of example, the top contact layer 214 may be formed of AZO at, by way of example, 1-3 μm using any suitable deposition means. In some embodiments, an insulating layer 212 may be deposited over the buffer layer 210 prior to deposition of the top contact layer 214. By way of example, the insulating layer 212 may be formed of an i-type material such as ZnO at a thickness in the range of approximately, by way of example, 100 nm.

Subsequently, various conventional processes such as edge isolation at 316, deposition of grids and/or busbars 216 at 318, deposition of an anti-reflective coating at 320, or light soaking at 322 may then follow prior to pre-testing and sorting at 324 and packaging and shipping.

In alternate embodiments, the alkali salt layer 206 may be deposited onto the top surface of the absorber layer 208 rather than, or in addition to, on the bottom contact layer 204, and incorporated into it by appropriate heat treatment (e.g., annealing). By way of example, a suitable heat treatment may include heating at approximately 200 degrees Celsius (° C.) for between approximately 5 minutes and 1 hour depending on the specific absorber configuration. However, the present inventors have determined that depositing the salt layer 206 prior to deposition of the absorber layer 208 aids in migration of the alkali metals into the absorber layer 208 as the alkali metals are more readily able to migrate during formation or crystallization of the absorber layer 208 as opposed to afterwards, when the absorber layer has already crystallized.

The present disclosure encompasses all changes, substitutions, variations, alterations, and modifications to the example embodiments described herein that a person having ordinary skill in the art would comprehend. Similarly, where appropriate, the appended claims encompass all changes, substitutions, variations, alterations, and modifications to the example embodiments described herein that a person having ordinary skill in the art would comprehend.

What is claimed is:

1. A method, comprising:
    depositing a conductive contact layer over a substrate suitable for use in a photovoltaic device;
    depositing a salt solution over the surface of the conductive contact layer, the solution comprising:
    a volatile solvent, and
    an alkali metal salt solute; and
    depositing a semiconducting absorber layer over the solution, wherein substantially all of the volatile solvent is evaporated before depositing the absorber layer thereby leaving a substantially uniform coating of the alkali metal salt over the surface of the conductive contact layer prior to depositing the absorber layer,
    wherein the volatile solvent evaporates in less than approximately 10 seconds thereby leaving a substantially uniform coating of the alkali metal salt over the surface of the conductive contact layer.

2. The method of claim 1, wherein the alkali metal salt solute comprises less than approximately 1 atomic percent of the solution.

3. The method of claim 1, wherein the volatile solvent evaporates in less than approximately 1 second thereby leaving a substantially uniform coating of the alkali metal salt over the surface of the conductive contact layer.

4. The method of claim 1, wherein the alkali metal salt solute is comprised of one or more alkali metals including one or more of lithium (Li), sodium (Na), potassium (K), rubidium (Rb), and caesium (Cs).

5. The method of claim 1, wherein the alkali metal salt solute is comprised of one or more cations including one or more of fluorine (F), chlorine (Cl), bromine (Br), iodine (I), sulfur (S), selenium (Se), tellurium (Te), and oxygen (O).

6. The method of claim 1, wherein the volatile solvent is comprised of one or more of acetone, ethanol, methanol, and water.

7. The method of claim 1, wherein the absorber layer is comprised of one or more layers each comprised of one or more of copper indium gallium diselenide, copper indium gallium selenide sulfide, and copper indium gallium disulfide, copper-indium-disulfide, or copper-indium-diselenide.

8. The method of claim 1, further comprising annealing the absorber layer.

9. The method of claim 1, further comprising depositing a semiconducting buffer layer over the absorber layer.

10. The method of claim 9, further comprising depositing a second conductive contact layer over the buffer layer.

11. The method of claim 1, wherein the substrate is a soda lime float glass substrate.

12. The method of claim 1, wherein depositing a salt solution over the surface of the conductive contact layer comprises spraying the salt solution over the surface of the conductive layer with a spray nozzle in the form of a fine mist.

13. The method of claim 1, wherein, prior to deposition of the absorber layer but after evaporation of the volatile solvent, the coating of the alkali metal salt over the surface of the conductive contact layer has a thickness greater than approximately 0 nanometers but less than approximately 25 nanometers.

14. The method of claim 1, further comprising heating the substrate concurrently with depositing the salt solution.

* * * * *